(12) United States Patent
Forke et al.

(10) Patent No.: US 8,887,568 B2
(45) Date of Patent: Nov. 18, 2014

(54) MICROMECHANICAL SYSTEM AND METHOD FOR BUILDING A MICROMECHANICAL SYSTEM

(75) Inventors: Roman Forke, Chemnitz (DE); Dirk Scheibner, Nürnberg (DE); Alexey Shaporin, Chemnitz (DE)

(73) Assignee: Siemens Aktiengesellschaft, Munich (DE)

( * ) Notice: Subject to any disclaimer, the term of this patent is extended or adjusted under 35 U.S.C. 154(b) by 217 days.

(21) Appl. No.: 13/138,852

(22) PCT Filed: Apr. 7, 2009

(86) PCT No.: PCT/EP2009/002773
§ 371 (c)(1),
(2), (4) Date: Oct. 7, 2011

(87) PCT Pub. No.: WO2010/115445
PCT Pub. Date: Oct. 14, 2010

(65) Prior Publication Data
US 2012/0024066 A1    Feb. 2, 2012

(51) Int. Cl.
*G01P 15/125*    (2006.01)
*B81B 3/00*    (2006.01)

(52) U.S. Cl.
CPC ............. *B81B 3/0078* (2013.01); *G01P 15/125* (2013.01); *B81B 2201/0235* (2013.01)
USPC ..................... 73/514.32; 73/514.38

(58) Field of Classification Search
USPC ............... 73/514.32, 514.38, 504.12, 504.14, 73/504.04
See application file for complete search history.

(56) References Cited

U.S. PATENT DOCUMENTS

| | | | |
|---|---|---|---|
| 5,953,824 A | 9/1999 | Ferraro et al. | |
| 5,955,668 A * | 9/1999 | Hsu et al. | 73/504.12 |
| 6,360,605 B1 * | 3/2002 | Pinter et al. | 73/514.38 |
| 7,129,617 B2 | 10/2006 | Hong | |
| 7,205,867 B2 * | 4/2007 | Lutz et al. | 333/186 |
| 7,679,152 B2 | 3/2010 | Klose et al. | |

(Continued)

FOREIGN PATENT DOCUMENTS

| CN | 2514314 | 10/2002 |
|---|---|---|
| CN | 1702489 | 11/2005 |

(Continued)

OTHER PUBLICATIONS

International Search Report for PCT/EP2009/002773, mailed Dec. 14, 2009.

(Continued)

*Primary Examiner* — Helen Kwok
(74) *Attorney, Agent, or Firm* — Staas & Halsey LLP

(57) ABSTRACT

A micromechanical system with a system that can vibrate, has a seismic mass and at least two spring elements. The spring elements are respectively fastened on one side externally to the seismic mass and on the other side to fixed anchor points of the micromechanical system such that the seismic mass can vibrate in a movement direction. In order to obtain a particularly large frequency spacing between the useful mode and further vibration modes of the system, at least one further spring element is provided in the inner region of the seismic mass. The further spring element the is fastened to a further anchor point of the micromechanical system. A method builds a micromechanical system with a system that can vibrate.

20 Claims, 3 Drawing Sheets

(56) References Cited

U.S. PATENT DOCUMENTS

| | | | |
|---|---|---|---|
| 8,056,415 B2 * | 11/2011 | McNeil et al. | 73/514.32 |
| 2003/0000306 A1 | 1/2003 | Fell | |
| 2003/0151983 A1 | 8/2003 | Speichinger et al. | |
| 2004/0025591 A1 | 2/2004 | Yoshikawa et al. | |
| 2006/0112764 A1 * | 6/2006 | Higuchi | 73/504.12 |
| 2006/0261915 A1 | 11/2006 | Lutz et al. | |
| 2008/0061784 A1 | 3/2008 | Pal et al. | |
| 2008/0110260 A1 * | 5/2008 | Konno et al. | 73/514.32 |
| 2008/0218295 A1 | 9/2008 | Lutz et al. | |
| 2008/0224319 A1 | 9/2008 | Nakamura | |

FOREIGN PATENT DOCUMENTS

| | | |
|---|---|---|
| CN | 1905976 | 1/2007 |
| CN | 101135559 | 3/2008 |
| CN | 101301991 | 11/2008 |
| EP | 1 900 095 | 9/2009 |
| JP | 11-114247 | 4/1999 |
| JP | 2003-521682 | 7/2003 |
| JP | 2003-248065 | 9/2003 |
| JP | 2008-221398 | 9/2008 |
| JP | 2008-545333 | 12/2008 |
| JP | 5-045402 | 6/2009 |
| WO | 02/12906 A1 | 2/2002 |
| WO | 03/044539 | 5/2003 |
| WO | 2006/135067 | 12/2006 |
| WO | PCT/EP2009/002773 | 4/2009 |

OTHER PUBLICATIONS

Tamal Mukherjee et al., "Optimal Synthesis Methods for MEMS, Chapter 10: System Level Synthesis"; Springer, Nov. 30, 2003, pp. 297-316.

Roman Forke et al., "Electrostatic force coupling of MEMS oscillators for spectral vibration measurements"; Elsevier, vol. 142, No. 1, Feb. 5, 2008, p. 276-283.

German language translation of Japanese Office Action for related Japanese Patent Application No. 2012-503862, issued May 31, 2013, 8 pages.

Office Action issued by the State Intellectual Property Office of the P.R. China on Nov. 27, 2013 in the corresponding Chinese patent application No. 200980158539.7.

* cited by examiner

MICROMECHANICAL SYSTEM AND METHOD FOR BUILDING A MICROMECHANICAL SYSTEM

CROSS REFERENCE TO RELATED APPLICATIONS

This application is based on and hereby claims priority to International Application No. PCT/EP2009/002773 filed on Apr. 7, 2009, the contents of which are hereby incorporated by reference.

BACKGROUND

Micromechanical systems, which are frequently also known as microsystems or MEMS (microelectromechanical systems), are being increasingly used, in particular due to their small size, their relatively low price and their high reliability. This relates to, for example, the use of micromechanical systems as actuators or sensors, for example, in the form of sensors for detecting acoustic emissions, structure-borne noise sensors, acceleration and inclination sensors, rotational frequency sensors or pressure sensors.

"Acoustic emissions", which are also known by the abbreviation "AE", are usually understood to mean a phenomenon with which elastic waves are generated by impulsive excitation due to a sudden release of energy within a solid body. Corresponding acoustic emission signals, which are propagated in the form of structure-borne noise in the solid body, usually occur in a frequency range from about 20 kHz to about 1 MHz. Hereby, acoustic emission signals are very sensitive with respect to mechanical damage to a solid body or an object. For this reason, micromechanical sensors for detecting acoustic emissions—acoustic emission sensors—are used in particular for monitoring wear on mechanical parts such as, for example, anti-friction bearings. Sensors of this type usually comprise a system that can vibrate with a seismic mass suspended or fastened on spring elements. External forces or accelerations cause a deflection of the seismic mass with respect to fixed anchor points, in the form of, for example, fixed suspensions. This relative movement is evaluated, wherein frequently a capacitive principle is used to obtain the signals. Hereby, the seismic mass comprises electrode arrangements, which can, for example, have a comb-like design and, together with a fixed counter-electrode, form a variable capacity. Hereby, the determination of the value of the capacity or a change thereto enables the detection of acoustic emissions.

A micromechanical system with a system that can vibrate, comprises a seismic mass and at least two spring elements, wherein the spring elements are respectively fastened on one side externally to the seismic mass and on the other side to fixed anchor points of the micromechanical system such that the seismic mass can vibrate in a movement direction. Hereby, "in a movement direction" means that the system that can vibrate has precisely one linear degree of freedom, i.e. that a movement of the system that can vibrate during the operation of the micromechanical system is provided in precisely one direction only, the movement direction.

A micromechanical system of this kind is known from the chapter "System-Level Synthesis" in "Optimal Synthesis Method for MEMS", Ananthasuresh, G. K. (Ed.), Springer, 2003, page 297-316.

There is currently a trend toward ever higher natural frequencies of micromechanical systems. This applies to both broadband applications and resonant, i.e. resonantly driven, systems. In addition to the aforementioned sensors for detecting acoustic emissions, further examples mentioned here are micromechanical filters and mixers for the high-frequency range.

Micromechanical systems with systems that can vibrate are frequently operated in the range of a resonant frequency, i.e. in the range of a normal mode determined by a corresponding natural frequency. Hereby, the frequency or the vibration shape associated with this frequency, for which the system that can vibrate is embodied or provided with respect to its operation, is also known as the useful mode. Hence, with a resonant operation, the useful mode is a normal mode, as a rule the first normal mode, of the system that can vibrate. Hereby, the vibration modes of higher natural frequencies can result in unwanted effects, such as, for example, superimposed interference signals or reduced sensitivity. For this reason, generally a larger frequency spacing, i.e. a mode separation, between the useful mode and the further vibration modes, in particular the other normal modes, of the system that can vibrate is desirable.

With resonant micromechanical systems, such as those used, for example, for sensors for detecting acoustic emission signals, there is usually a requirement for high stiffness of the system that can vibrate in the movement direction or useful direction. In addition, in order to avoid movements directed out of the envisaged movement direction, as a rule, again a much higher stiffness transverse to the movement direction is desirable. On the other hand, large-surface electrodes or electrode systems are required to achieve sufficiently high sensitivity of the micromechanical system. However, electrodes of this kind result in an influence of the dynamic response of the micromechanical system and there is a risk that the other normal modes of the system that can vibrate may occur in a relatively small frequency spacing relative to the useful mode (which, as already mentioned above, as a rule, corresponds to the main mode, i.e. the first normal mode). Hereby, the preferred direction of corresponding higher vibration modes can both lie within the plane clamped by the micromechanical system and also extend outside this plane. Vibration modes of the last-named type occur in particular with two-dimensional structures and are known as "membrane modes" or "out-of-plane modes".

In principle, one measure to enlarge the frequency spacing between the vibration modes of the system that can vibrate of the micromechanical system can include enlarging the structural thickness of the micromechanical system. However, this is not simple to achieve with the known dry etching processes. In addition, this would only enable an improvement of the separation of the "out-of-plane modes" from the "in-plane modes" of the system that can vibrate.

It is also known from the aforementioned publication "System-Level Synthesis" that an improvement of the spacing between normal modes of a system that can vibrate can be achieved by reducing the number of electrodes. However, this has the drawback that, as a rule, this simultaneously significantly reduces the sensitivity of the micromechanical system.

SUMMARY

The present inventors propose a micromechanical system with a system that can vibrate, which has a seismic mass and at least two spring elements, wherein the spring elements are respectively fastened on one side externally to the seismic mass and on the other side to fixed anchor points of the micromechanical system such that the seismic mass can vibrate in a movement direction, wherein its useful mode has a particularly large frequency spacing with respect to further vibration modes of the system that can vibrate.

More specifically, the present inventors propose a micromechanical system with a system that can vibrate with a seismic mass and at least two spring elements, wherein the spring elements are respectively fastened on one side externally to the seismic mass and on the other side to fixed anchor points of the micromechanical system such that the seismic mass can vibrate in a movement direction, wherein at least one further spring element is provided in the inner region of the seismic mass and by said further spring element the seismic mass is fastened to a further anchor point of the micromechanical system.

The microelectromechanical system is advantageous since the at least one spring element additionally provided in the inner region of the seismic mass enables a change to the dynamic response of the system that can vibrate in such a way that the frequency spacing between the normal modes of the system that can vibrate, in particular between the useful mode, i.e. for example the first normal mode, and the other normal modes, is optimized. This can be achieved on the one hand by the fact that certain resonances, i.e. certain normal modes, of a higher frequency are completely suppressed or that the frequency spacing between the frequency of the useful mode and the frequencies of further normal modes is enlarged. A basic advantage of the micromechanical system relates to the fact that the sensitivity of the micromechanical system or of the system that can vibrate of the micromechanical system is not influenced by the optimization and hence remains unchanged. According to a particularly preferred further development, the micromechanical system is embodied in such a way that the system that can vibrate has a resonant frequency in the ultrasonic range. This is advantageous since, in particular in the case of vibration or normal modes with resonant frequencies in the ultrasonic range, a sufficient frequency spacing of the useful mode used by the micromechanical system during operation from further vibration modes, in particular normal modes, of the micromechanical system is necessary.

In principle, the spring elements of the system that can vibrate can be embodied in any style. According to a further particularly preferred embodiment of the micromechanical system, the spring elements are embodied as bow springs. This offers the advantage that, in the case of a deflection of the springs, this prevents stiffening of the springs as a result of the so-called "stress-stiffening effect". In addition, the transverse stiffness is increased to the effect that movements deviating from the envisaged movement direction are also suppressed.

Preferably, the micromechanical system can also be further developed in such a way that the at least one further spring element is embodied as a bow spring. According to the previous embodiments, the use of a bow spring as the further spring element is advantageous to the effect that this avoids stiffening of the further spring element under stress and the transverse stiffness of the system that can vibrate is increased.

The micromechanical system can, for example, be any system provided for applications which are known per se. This includes, for example, different types of actuators. According to a further particularly preferred embodiment of the micromechanical system, the spring elements are embodied as bow springs. This offers the advantage that, in the case of a deflection of the springs, this prevents stiffening of the springs as a result of the so-called "stress-stiffening effect". In addition, the transverse stiffness is increased to the effect that movements deviating from the envisaged movement direction are also suppressed.

Preferably, the micromechanical system can also be further developed in such a way that the at least one further spring element is embodied as a bow spring. According to the previous embodiments, the use of a bow spring as the further spring element is advantageous to the effect that this avoids stiffening of the further spring element under stress and the transverse stiffness of the system that can vibrate is increased.

The micromechanical system can, for example, be any system provided for applications which are known per se. This includes, for example, different types of actuators. According to a further particularly preferred embodiment, the micromechanical system is embodied as a sensor. This is advantageous since, due to their relatively low price and their high reliability, micromechanical sensors are increasingly being used for different applications.

According to a further particularly preferred embodiment, the micromechanical system is embodied as a sensor for detecting acoustic emission signals. This is advantageous since, as a rule, sensors for detecting acoustic emissions detect vibrations above the audible range, i.e. for example in the ultrasonic range. As already explained above, here, sufficient separation of the useful mode used for the operation of the micromechanical system, i.e., as a rule, of the first vibration or normal mode, from the further vibration modes of the system that can vibrate of the micromechanical system is particularly desirable.

With respect to the method, one potential object is a micromechanical system with a system that can vibrate, wherein its useful mode has a particularly large frequency spacing with respect to further vibration modes of the system that can vibrate.

The inventors propose a method for creating a micromechanical system with a system that can vibrate comprising a seismic mass and at least two spring elements, wherein the spring elements are respectively fastened on one side externally to the seismic mass and on the other side to fixed anchor points of the micromechanical system such that the seismic mass can vibrate in a movement direction, wherein with the method by an analysis of the vibration modes of the system that can vibrate in the inner region of the seismic mass, at least one point is determined at which the one vibration amplitude occurs perpendicularly to the movement direction, and at the at least one point, a further spring element is provided, by which the seismic mass is fastened to a further anchor point of the micromechanical system.

The method is advantageous since it enables the creation or development of a micromechanical system, which, due to the further spring element provided in the inner region of the seismic mass, is designed in such a way that unwanted vibration modes are suppressed or their frequency is displaced higher frequencies. Advantageously, this avoids a deterioration of the sensitivity of the micromechanical system.

Preferably, the method can be embodied in such a way that the total spring stiffness of the system that can vibrate is adapted in such a way that the frequency of a useful mode provided for the operation of the micromechanical system is not changed by the at least one further spring element. This is advantageous since this means that, during the creation or design of the micromechanical system, an influence of the frequency of the useful mode provided for the operation of the micromechanical system, i.e. as a rule the first normal mode, is advantageously avoided.

According to a further particularly preferred embodiment of the method, the steps of the method are repeated iteratively. An iterative method of this kind is advantageous since, as a rule, it permits the greatest possible optimization of the micromechanical system. Hereby, iteration is preferably performed until it achieves a further increase in the frequency spacing between the useful mode provided for the operation of the micromechanical system and the further vibration modes.

Preferably, the method can also be embodied in such a way that the analysis of the vibration modes of the system that can vibrate is performed using a computer-aided simulation model. This is advantageous since the use of a computer-aided simulation model enables a particularly powerful and relatively low-overhead optimization of the micromechanical system.

In principle, it is possible to use as the simulation model different methods which are known per se in connection with corresponding optimization requirements in different area of technology. According to a particularly preferred embodiment of the method, a model according to a finite-element method (FEM) is used as the simulation model. This is advantageous since this a powerful computer-aided calculation method, which is widely used in engineering.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
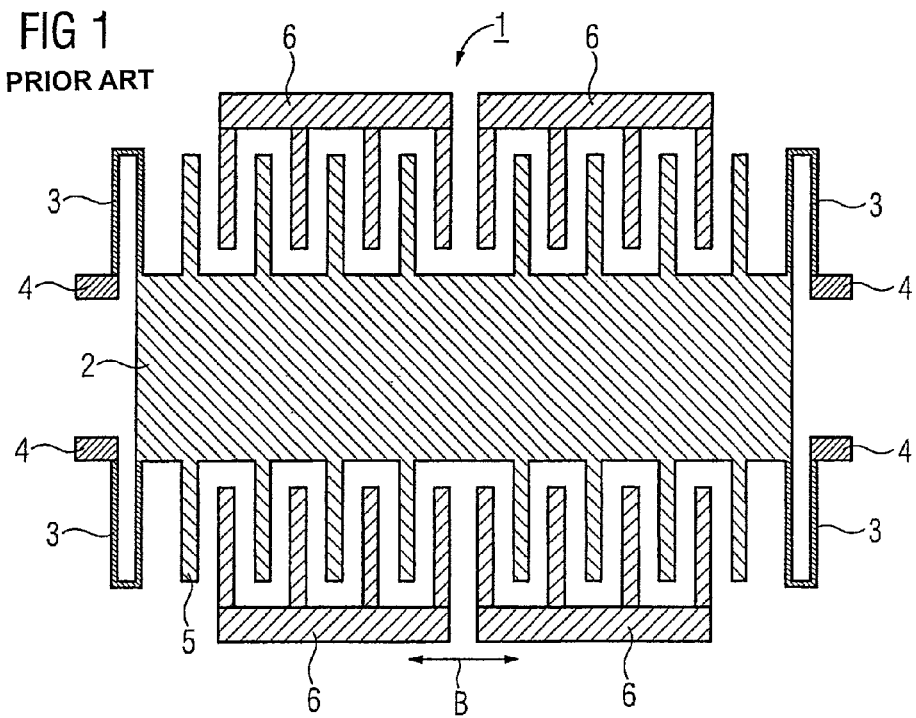
FIG. 1 shows a schematic sketch, a conventional micromechanical system with a system that can vibrate.

Reference will now be made in detail to the preferred embodiments of the present invention, examples of which are illustrated in the accompanying drawings, wherein like reference numerals refer to like elements throughout.

For reasons of clarity, identical reference characters are used in the figures for the same components or for components having the same functions. It should also be noted that FIGS. 1, 2, 5 and 6 in each case show a top view of the respective structure.

FIG. 1 shows in a schematic sketch a conventional micromechanical system with a system that can vibrate. This shows a micromechanical system 1 with a system that can vibrate, comprising a seismic mass 2 and four spring elements 3. According to the representation in FIG. 1, the spring elements 3 are hereby fastened on one side externally to the seismic mass 2. In addition, the spring elements 3 on the other side are fastened to fixed anchor points 4 of the micromechanical system. Hereby, the structure of the system that can vibrate is designed such a way the seismic mass 2 can vibrate exclusively in a horizontal movement direction B.

In addition to the aforementioned elements, the micromechanical system 1 comprises a moving electrode 5 with a comb-like design. For reasons of clarity, hereby, in FIG. 1, only one of the bar-shaped elements of the moving electrode is identified by the corresponding reference number.

The bar-shaped elements of the moving electrode 5 engage in corresponding elements of a fixed electrode 6 functioning as a counter-electrode. An excitation of the system that can vibrate, for example by mechanical vibrations, effects a change in the capacity of the micromechanical system 1, so that a corresponding change in the capacity can be used to detect vibrations. Such vibrations can be, for example, acoustic emission signals formed during the operation of an anti-friction bearing, which are propagated in a solid body as structure-borne noise and are detected by the micromechanical system 1.

The conventional micromechanical system 1 shown in FIG. 1 has the drawback that the further vibration modes or normal modes occur in a relatively small frequency spacing with respect to the main mode or first normal mode. Depending upon the circumstances in question, hereby the preferred direction of the corresponding higher frequency normal modes can both extend in the plane of the structure, i.e. in the top view in FIG. 1 in the wafer plane corresponding to the sheet or drawing plane and also be directed out of this plane.

Figure 2:
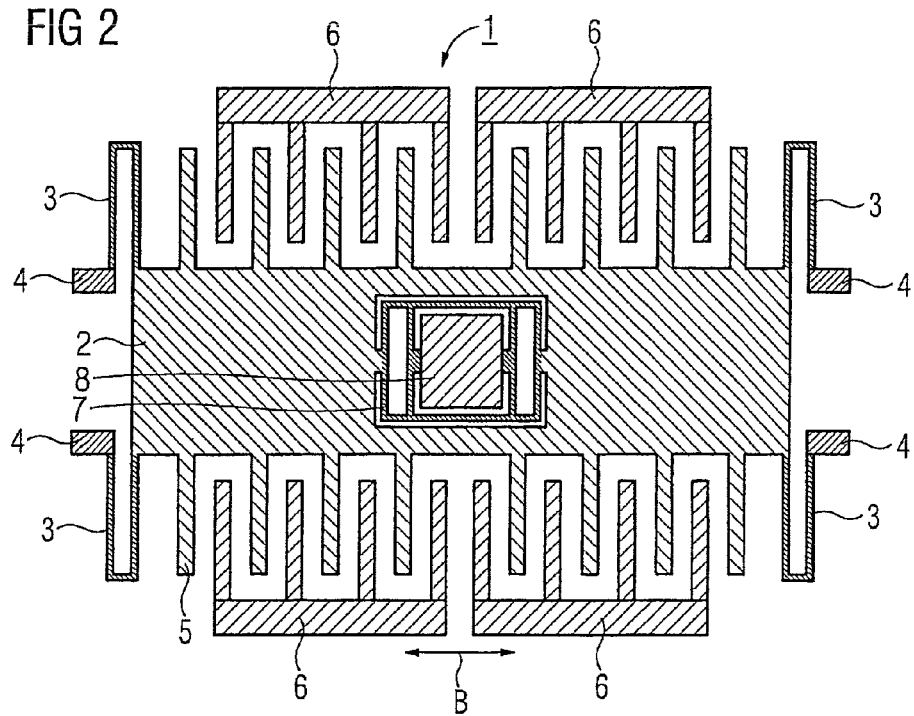
FIG. 2 shows a schematic sketch, a first exemplary embodiment of the micromechanical system proposed by the inventors.

FIG. 2 shows in a schematic sketch a first exemplary embodiment of the micromechanical system. While the other components of the micromechanical system 1 in FIG. 2 correspond to those in FIG. 1, the micromechanical system 1 according to FIG. 2 advantageously also comprises in the inner region of the seismic mass 2 a further spring element 7, by which the seismic mass 2 is fastened to a further anchor point 8 of the micromechanical system 1. This is advantageous since, the further spring element 7 enables a specific influence on the dynamic response of the micromechanical system 1 or on the system that can vibrate of the micromechanical system 1. This achieves a specific suppression of higher normal modes of vibration or an enlargement of the mode separation, i.e. in particular an increase in the frequency spacing between the useful mode and the other normal modes of the system that can vibrate. Finally, the additionally provided further spring element 7 hence effects a stiffening of interfering or unwanted vibration modes of the micromechanical system 1, wherein hereby the sensitivity of the micromechanical system 1 advantageously remains unchanged. Hereby, the embodiment of the further spring element 7 as a bow spring advantageously prevents a deflection-induced stiffening of the further spring element 7 due to the so-called "stress-stiffening effect".

Specifically, the micromechanical system 1 in FIG. 2 can, for example, be created or designed or developed with respect to its structure in such a way that, according to a first design of the micromechanical system, a modal analysis is performed with the aid of computer-aided simulation models that are known per se according to a finite-element method (FEM). The modal analysis provides an overview of the higher vibration modes of the micromechanical system 1. Higher vibration modes of this kind are frequently "out-of-plane" movements directed out of the wafer plane, while the actual useful mode according to the above embodiments represents a lateral movement of the system that can vibrate of the micromechanical system in the movement direction.

By the analysis of the vibration modes of the system that can vibrate, now at least one point is determined in the inner region of the seismic mass 2 at which the one vibration amplitude occurs perpendicularly to the movement direction B. Advantageously, hereby, the point determined is that at which the highest corresponding vertical amplitude occurs. Taking into account technological feasibility, at this point specifically at least one further spring element 7 is provided, by which the seismic mass 2 is fastened to the further anchor point 8 of the micromechanical system 1. Hence, the further spring element 7 and the further anchor point 8 achieve a further bearing or a further suspension of the seismic mass 2.

In the following, advantageously the total spring stiffness of the system that can vibrate of the micromechanical system 1 is adjusted in such a way that it once again corresponds to the original value. Hence, as a result, only the higher frequencies or normal modes of the system that can vibrate are suppressed or displaced to higher frequencies. However, hereby, the frequency of the useful mode preferably remains unchanged.

The above-named steps can advantageously be repeated within an iteration until an optimum is established. Hereby, the implementation of the entire method described is preferably computer-aided, i.e. software-based.

Figure 3:
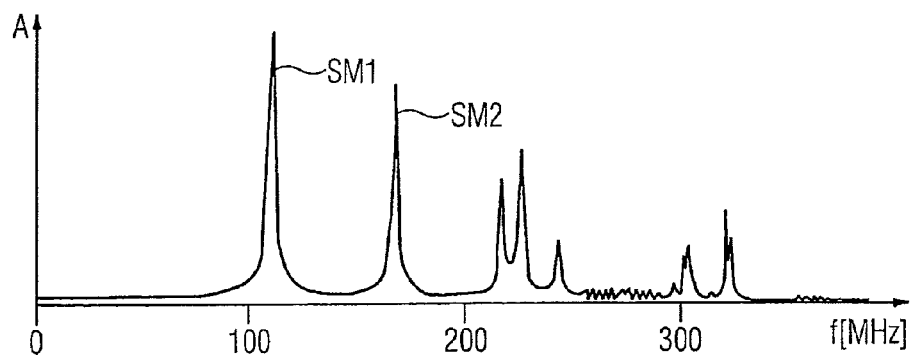
FIG. 3 shows the frequency spectrum of the conventional micromechanical system according to FIG. 1.

FIG. 3 shows the frequency spectrum of the conventional micromechanical system according to FIG. 1. To be more precise, the frequency spectrum shown is the result of a simulation calculation using a finite-element method, wherein the simulation calculation was based on micromechanical system with a structure substantially corresponding to the schematic representation in FIG. 1.

In the representation, in which the amplitude A of the vibration of the system that can vibrate is plotted as a function of the frequency f in kHz, it is identifiable that, with the conventional micromechanical system, in addition to the first normal mode SM1 at slightly more than 100 kHz, a further normal mode SM2 occurs at a frequency only slightly more than 150 kHz. This further normal mode SM2 is undesirable since it results, or can result, in a disruption of the function of the micromechanical system or in a reduction of the sensitivity of said system.

Figure 4:
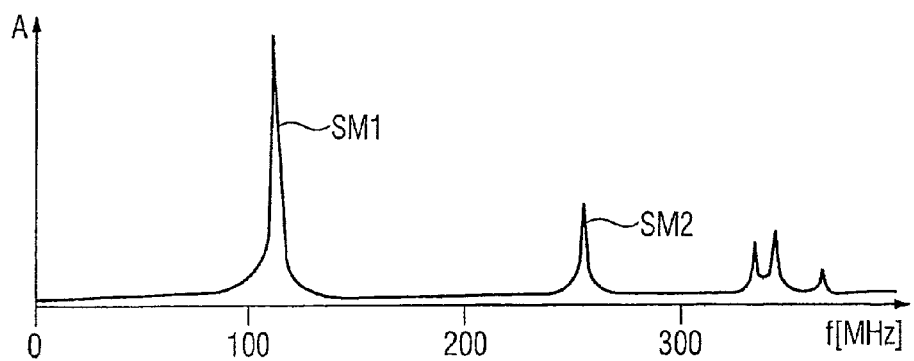
FIG. 4 shows the frequency spectrum of the micromechanical system according to the exemplary embodiment in FIG. 2.

FIG. 4 shows the frequency spectrum of the micromechanical system according to the exemplary embodiment in FIG. 2. To be more precise, similarly to FIG. 3, the frequency spectrum shown is again in turn the result of a simulation calculation using a finite-element method, wherein the simulation calculation is based on a micromechanical system with a structure substantially corresponding to the schematic representation in FIG. 2.

In a comparison of FIG. 4 with FIG. 3, it is plainly evident that, due to the fact that, with the micromechanical system 1 according to FIG. 2, a further spring element 7 is also provided in the inner region of the seismic mass 2 by which the seismic mass 2 is fastened to a further anchor point 8 of the micromechanical system 1, a clear improvement in the mode separation of the system that can vibrate of the micromechanical system 1 is achieved. For example, the frequency of the first normal mode SM1 is substantially unchanged. On the other hand, the further normal mode SM2 advantageously only occurs above about 250 kHz. Interference to a measurement from the micromechanical system 1 in the range of the first natural or vibration mode SM1 from the further or second vibration mode SM2 can hence hereby be advantageously reliably excluded.

Figure 5:
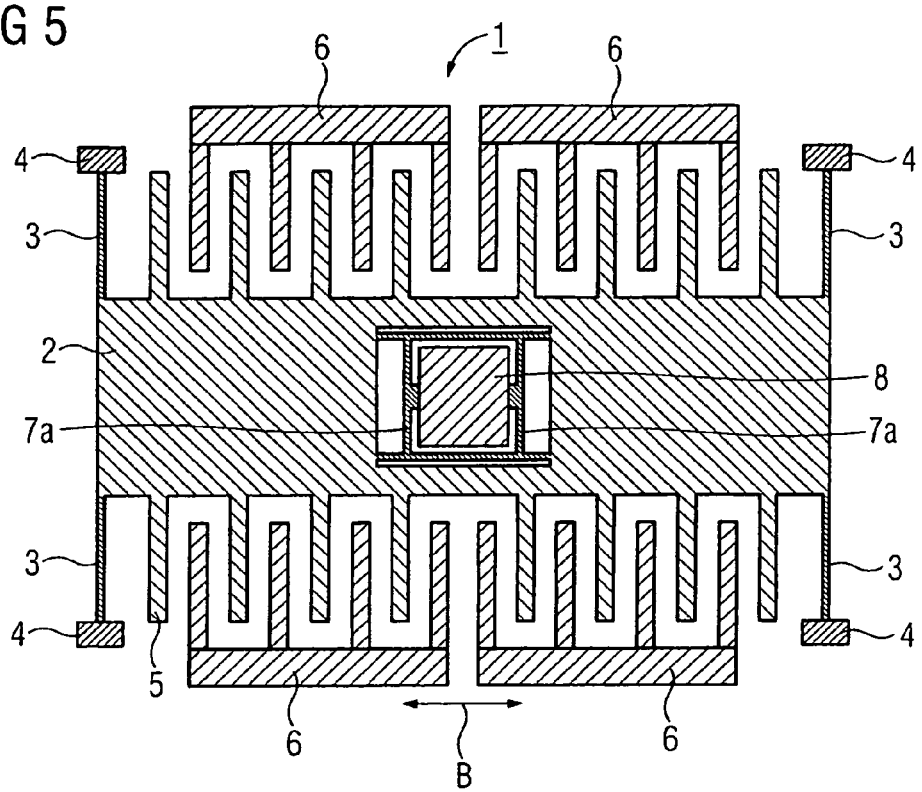
FIG. 5 shows a schematic sketch, a further exemplary embodiment of the proposed micromechanical system

FIG. 5 shows in a schematic sketch a further exemplary embodiment of the micromechanical system. The representation in FIG. 5 substantially corresponds to that in FIG. 2, wherein, unlike the case in FIG. 2, two further spring elements 7a are provided in the inner region of the seismic mass 2, by which the seismic mass 2 is fastened to the further anchor point 8 of the micromechanical system 1. As in FIG. 2, the structure of the spring elements 3 and the further spring elements 7a hereby enables a linear movement of the seismic mass 2 in the movement direction B.

Compared to FIG. 2, the total stiffness of the system that can vibrate is much greater with the embodiment according to FIG. 5. This is the result of both the spring elements 3 embodied as individual spring bands on the outer side the seismic mass 2 and also of the attributes of the further spring elements 7a. In addition, the space requirement with the further spring elements 7a is advantageously lower than it is with the further spring element 7 FIG. 2.

Generally, reference is made to the fact a combination of different shapes of springs for the spring elements 3 and the further spring elements 7a is possible. Hereby, the respective decision is advantageously depending determined by the envisaged field of application or the desired useful mode, i.e. the desired natural frequency of the system that can vibrate for the operation of the micromechanical system.

Figure 6:
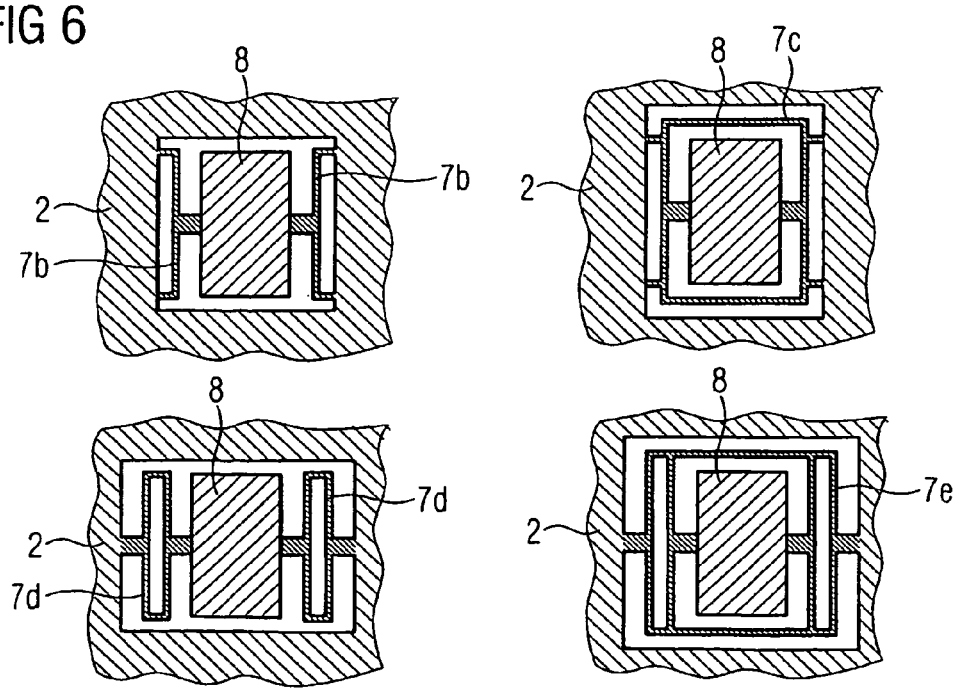
FIG. 6 shows exemplary embodiments of further spring elements of the proposed micromechanical system.

FIG. 6 shows exemplary embodiments of further spring elements of the micromechanical system. This shows further spring elements 7b, 7c, 7d, 7e, which, together with the respective further anchor point 8, each implement a central suspension of the seismic mass 2.

The embodiment shown on the top left in FIG. 6, which is similar to or same as that in FIG. 5, has the advantage that the spring system formed from the spring elements 7b has high stiffness and a lower space requirement.

On the other hand, the embodiment according to the depiction shown on the top right in FIG. 6 has the advantage that the further spring element 7c, which is embodied in the form of a bow spring, has high stiffness and also quite distinctly works toward a linear movement in the movement direction. This means that the further spring element 7c particularly effectively suppresses vibration modes deviating from the movement direction of the system that can vibrate.

The embodiment shown on the bottom left in FIG. 6 with two further spring elements 7d has, on the other hand, in particular the advantage of low material stress in the further spring elements 7d.

The embodiment shown on the bottom right in FIG. 6, which is similar to that in FIG. 2, represents, so to speak, a combination of the two embodiments mentioned above. For example, the use of a further spring element 7e embodied as a bow spring in particular again supports a linear movement of the seismic mass 2 or of the system that can vibrate of the micromechanical system.

According to the above embodiments, the micromechanical system and the method in particular have the advantage that, due to the provision of a central suspension for the seismic mass, i.e. due to the fact that at least one further spring element is or will be additionally provided in the inner region of the seismic mass, by which the seismic mass is or will be fastened to a further anchor point of the micromechanical system, a specific and effective influence on the dynamic properties of the system that can vibrate of the micromechanical system is achieved to the effect that the separation between the useful mode during the operation of the micromechanical system and further vibration modes of the system that can vibrate is enlarged or improved.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide* v. *DIRECTV*, 69 USPQ2d 1865 (Fed. Cir. 2004).

The invention claimed is:

1. A micromechanical system, comprising:
   a seismic mass having an inner region surrounded by an external region; and
   a plurality of spring elements supporting the seismic mass so that the seismic mass can vibrate, the spring elements comprising:
      at least two outer spring elements, each having first and second sides with the first side being fastened to an external side of the seismic mass and the second side being fastened to a fixed anchor point of the micromechanical system; and
      an inner spring element having first and second sides with the first side being fastened to the inner region of the seismic mass and the second side fastened to an inner anchor point of the micromechanical system, the inner spring element being fastened to a point on the inner region of the seismic mass that has a vibration amplitude perpendicular to a movement direction of the seismic mass.

2. The micromechanical system as claimed in claim 1, wherein the seismic mass vibrates at a resonant frequency in an ultrasonic range.

3. The micromechanical system as claimed in claim 1, wherein the outer spring elements are embodied as bow springs.

4. The micromechanical system as claimed in claim 1, wherein the inner spring element is embodied as a bow spring.

5. The micromechanical system as claimed in claim 1, wherein
   the seismic mass comprises a comb pattern electrode,
   the micromechanical system further comprises a capacitive fixed counter-electrode, and
   the comb pattern electrode and the fixed counter-electrode have a varying capacitance used as a sensor output.

6. The micromechanical system as claimed in claim 5, wherein the micromechanical system is embodied as a sensor for detecting acoustic emission signals.

7. The micromechanical system as claimed in claim 1, wherein there are a plurality of inner spring elements.

8. The micromechanical system as claimed in claim 2, wherein the outer spring elements are embodied as bow springs.

9. The micromechanical system as claimed in claim 8, wherein the inner spring element is embodied as a bow spring.

10. The micromechanical system as claimed in claim 9, wherein
    the seismic mass comprises a comb pattern electrode,
    the micromechanical system further comprises a capacitive fixed counter-electrode, and
    the comb pattern electrode and the fixed counter-electrode have a varying capacitance used as a sensor output.

11. The micromechanical system as claimed in claim 10, wherein the micromechanical system is embodied as a sensor for detecting acoustic emission signals.

12. The micromechanical system as claimed in claim 11, wherein there are a plurality of inner spring elements.

13. A method for building a micromechanical system having a seismic mass supported by at least two outer spring elements, each having first and second sides with the first side being fastened to an external side of the seismic mass and the second side being fastened to a fixed anchor point of the micromechanical system such that the seismic mass can vibrate in a movement direction, the method comprising:
    analyzing vibration modes of the system;
    identifying a point in an inner region of the seismic mass, the point having a vibration amplitude perpendicular to the movement direction; and
    providing an inner spring element for the point, the inner spring element having first and second sides with the first side being fastened to the point on the seismic mass and the second side being fastened to a further anchor point of the micromechanical system.

14. The method as claimed in claim 13, further comprising:
    adapting a total spring stiffness of the inner and outer spring elements in such a way that a useful mode operation frequency for the micromechanical system is not changed by providing the inner spring element.

15. The method as claimed in claim 13, wherein the analyzing vibration modes of the system, the identifying a point in an inner region and the providing an inner spring are repeated iteratively.

16. The method as claimed in claim 13, wherein the vibration modes are analyzed using a computer-aided simulation model.

17. The method as claimed in claim 16, wherein the simulation model models the system according to a finite-element method.

18. The method as claimed in claim 14, wherein the analyzing vibration modes of the system, the identifying a point in an inner region and the providing an inner spring are repeated iteratively.

19. The method as claimed in claim 18, wherein the vibration modes are analyzed using a computer-aided simulation model.

20. The method as claimed in claim 19, wherein the simulation model models the system according to a finite-element method.

* * * * *